(12) United States Patent  
Berens

(10) Patent No.: US 7,391,278 B2
(45) Date of Patent: Jun. 24, 2008

(54) OSCILLATOR WITH STACKED AMPLIFIER

(75) Inventor: Michael Berens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 31 days.

(21) Appl. No.: 11/461,120

(22) Filed: Jul. 31, 2006

(65) Prior Publication Data
US 2008/0042769 A1 Feb. 21, 2008

(51) Int. Cl.
H03B 5/36 (2006.01)
(52) U.S. Cl. .............................. 331/116 R; 331/116 FE
(58) Field of Classification Search ............. 331/108 R, 331/109, 116 R, 116 FE, 116 M, 117 R, 117 FE, 331/117 D, 158, 159, 182, 183, 185, 186
See application file for complete search history.

(56) References Cited

U.S. PATENT DOCUMENTS 4,196,404 A 4/1980 Ebihara ................ 331/116 FE
4,360,789 A 11/1982 Lewyn et al. ................ 331/109
5,113,156 A 5/1992 Mahabadi et al. ........... 331/109
2004/0183608 A1* 9/2004 Satoh .......................... 331/158

OTHER PUBLICATIONS

W. Thommen, "An Improved Low Power Crystal Oscillator," Proceedings of the IEEE, vol. 54, Issue 12, Dec. 1966, pp. 1953-1954.

* cited by examiner

Primary Examiner—David Mis
(74) Attorney, Agent, or Firm—Hamilton & Terrile, LLP; Gary W. Hamilton

(57) ABSTRACT

Embodiments of the invention provide a low-power, high-gain amplifier for a crystal oscillator. In some embodiments, the oscillator amplifier circuit comprises two NMOS transistors stacked in series with a PMOS transistor. In various embodiments, each of the NMOS transistors is diode-connected through a resistor and has the input signal capacitively coupled onto its control terminal. The stacked amplifier raises the DC level of the amplified oscillatory signal and can support a substantial oscillation amplitude without clipping.

18 Claims, 4 Drawing Sheets

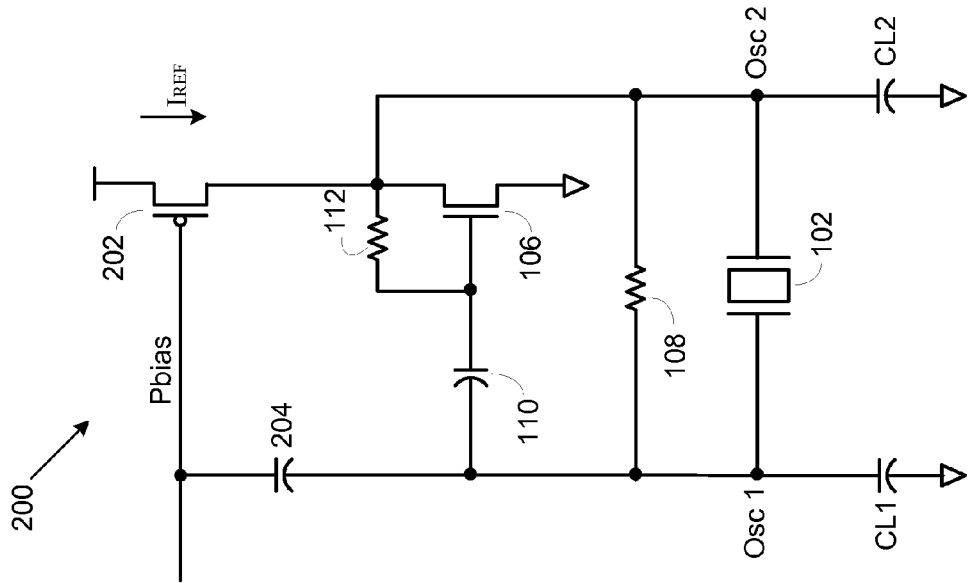
Figure 2 *Prior Art*
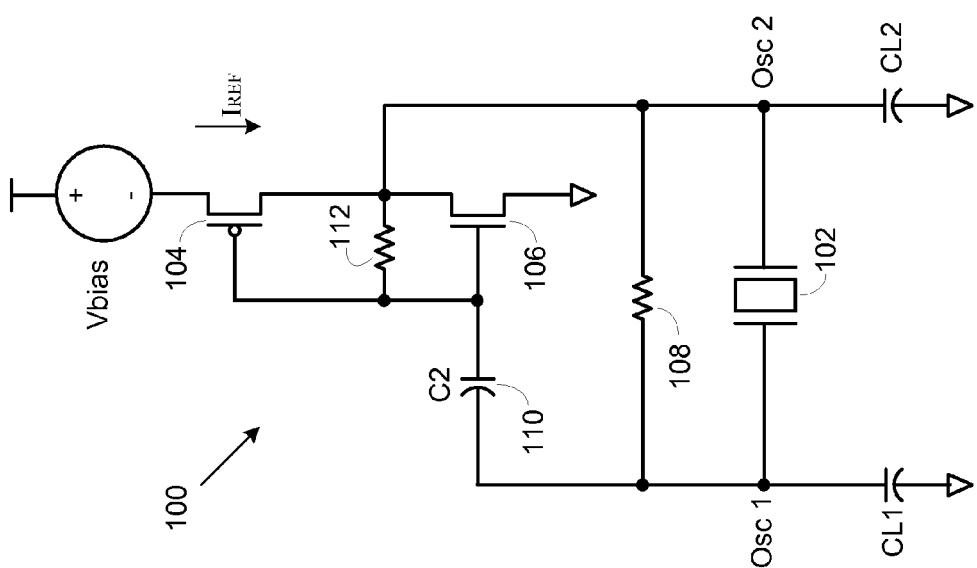
Figure 1 *Prior Art*

OSCILLATOR WITH STACKED AMPLIFIER

BACKGROUND OF THE INVENTION

1. Field of the Invention

The present invention relates in general to the field of electronic circuitry and, more specifically, to a system and method for providing an oscillator amplifier.

2. Description of the Related Art

Crystal oscillator amplifiers are used extensively in a wide variety of electronic circuits. As microelectronic fabrication processes advance, there is an increasing demand for oscillator amplifiers that are capable of providing accurate high-gain signal amplification, while consuming minimal power. Nominal threshold voltages in many new NMOS fabrication processes are 500 mV or less. The combination of process and temperature variation can reduce the threshold voltage, $V_{th}$, of the amplifier by more than 200 mV, meaning that a nominal $V_{th}$ of 500 mV could be less than 300 mV in some cases. The DC bias voltage of a typical NMOS Pierce oscillator, which is operated in weak inversion, can therefore be 200 mV or less. As a result, such an oscillator cannot always support peak-to-peak amplitudes greater than 400 mV without clipping its output, thus creating susceptibility to noise and electromagnetic interference (EMI). It also limits the amount of hysteresis that can be designed into the buffer circuit used to convert the sinusoidal signal into a square wave.

In view of the foregoing, it is apparent that there is a need for a general purpose low power crystal oscillator circuit which maximizes signal-to-noise ratio (SNR) and which does not distort or add harmonics into the signal. In particular, there is a need for a low-power, high-gain amplifier for a crystal oscillator which can support a substantial oscillation amplitude greater than 1Vpp without clipping.

Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which:

FIG. 1 is an illustration of a prior art oscillator amplifier implemented in an inverter configuration;

FIG. 2 is an illustration of a prior art oscillator amplifier implemented in a push-pull configuration;

DETAILED DESCRIPTION

Figure 3:
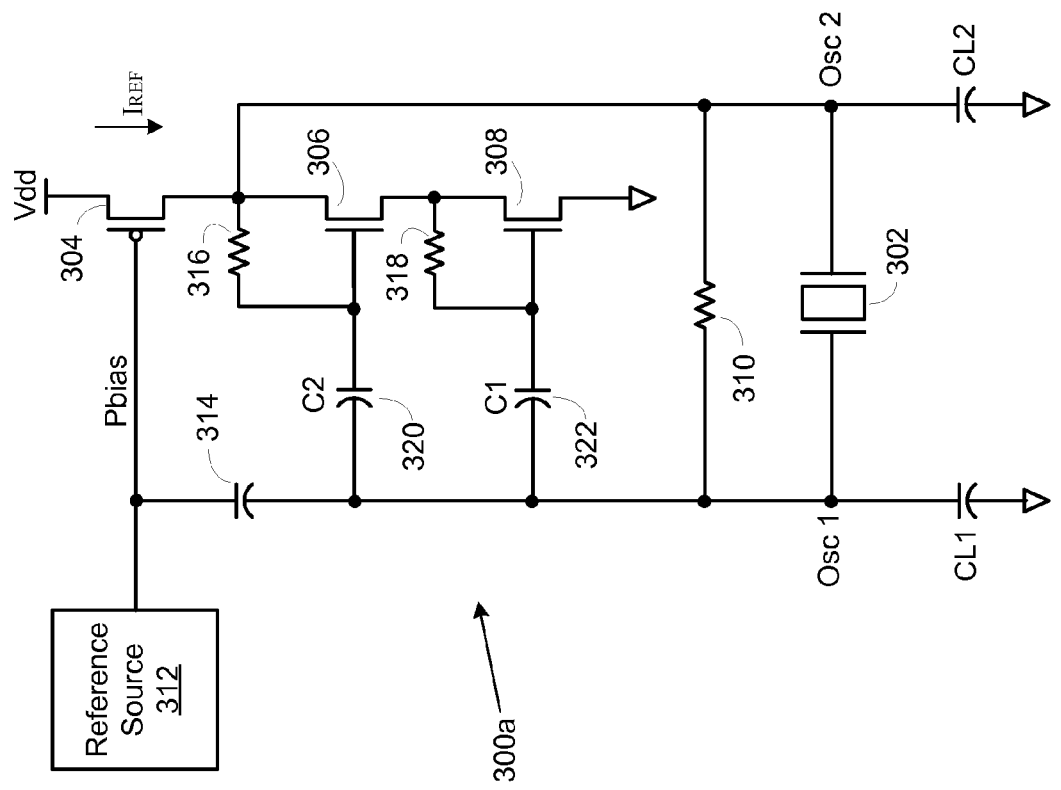
FIG. 3 is a schematic illustration of an oscillator amplifier in accordance with an embodiment of the present invention.

Embodiments of circuitry are described for creating an amplifier for a crystal oscillator that can support a substantial oscillation amplitude without clipping. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings in order to avoid limiting or obscuring the present invention. Such descriptions and representations are used by those skilled in the art to describe and convey the substance of their work to others skilled in the art. Various illustrative embodiments of the present invention will now be described in detail with reference to the figures.

FIG. 1 is a schematic illustration of a prior art oscillator amplifier 100. The oscillator is broadly comprised of a piezoelectric oscillation source 102, a PMOS transistor 104 and an NMOS transistor 106. A bias resistor 108 is connected to the two terminals OSC1 and OSC2 of the oscillation source 102. The source of transistor 104 is connected to a source, Vbias, that is amplitude-controlled and reduced to a level approximately equal to the sum of the threshold voltages. The gates of transistors 104 and 106 are connected together and are coupled to the OSC1 terminal via capacitor 110, which isolates the gates of these transistors from any current drain associated with the OSC1 terminal. The drains of the transistors 104, and 106 are connected and are coupled to the gates via resistor 112. The drains are also connected to the OSC2 output terminal.

FIG. 2 is a schematic illustration of a prior art oscillator 200 implemented with an amplitude-controlled bias configuration. The oscillator amplifier 200 comprises many of the components discussed above in connection with the oscillator amplifier 100. The PMOS transistor 202 provides a reference current which is modulated by using capacitor 204 to provide capacitive coupling of the input signal onto the gate of PMOS transistors 202. An oscillator amplifier having the configuration shown in FIG. 2 is sometimes referred to as a "push-pull" oscillator amplifier.

One of the disadvantages of the oscillator amplifier 100 shown in FIG. 1 and the oscillator amplifier 200 shown in FIG. 2 is their susceptibility to clipping. For example, the oscillator 200 shown in FIG. 2 can only support an amplitude of approximately $2*V_{th}$ before clipping the output signal, resulting in distortion and undesired harmonics.

FIG. 3 is a schematic illustration of an oscillator amplifier circuit 300a in accordance with an embodiment of the present invention. The embodiments of the oscillators described herein can be implemented using semiconductor devices of first and second conductivity types, with each of the individual semiconductor devices having a control terminal and first and second current terminals. Various embodiments of the invention may be described using N-type and P-type MOS semiconductor devices. In the example embodiments described using MOS devices, the control terminal will sometimes be referred to as a "gate" and the current terminals will sometimes be referred to as a "source" or "drain," depending on the conductivity type and the potential of the respective terminal. Those of skill in the art will appreciate that embodiments of the oscillator circuit of the present invention can also be implemented using bipolar semiconductor devices. Furthermore, those of skill in the art will appreciate that embodiments within the scope of the invention can be implemented by substituting semiconductor devices having a first conductivity type with semiconductor devices having a second conductivity type, and vice-versa.

The embodiment of the oscillator 300a shown in FIG. 3a is broadly comprised of a piezo-electric oscillation source 302, PMOS transistor 304 and a stacked amplifier comprising NMOS transistors 306 and 308. In various embodiments of the invention, the oscillation source 302 comprises a piezo-electric oscillation source, such as a crystal, or other oscillation sources, such as resonators or precision timing references. A bias resistor 310 is connected to the terminals OSC1 and OSC2 of the oscillation source 302. The source of PMOS transistor 304 is connected to Vdd and its gate is connected to a reference source 312, which provides a bias voltage, Pbias. The PMOS transistor 304 receives the bias voltage, Pbias, as an input, and provides a controlled reference current $I_{REF}$, to the NMOS transistors 306 and 308. This reference current is modulated by using capacitor 314 to provide capacitive coupling of the input signal onto the gate of PMOS transistor 304 to improve efficiency. In various embodiments, the oscillator amplifier can be implemented with a controlled bias current that is either fixed or amplitude-controlled. Furthermore, those of skill in the art will appreciate that embodiments of the invention can be implemented using reference voltages rather than reference currents.

The NMOS transistors 306 and 308 are independently DC biased by diode connections of their respective gates and drains via resistors 316 and 318, respectively. Each of the NMOS transistors 306 and 308 has the input signal capacitively coupled to its gate by capacitors 320 and 322, respectively. The capacitors 320 and 322 also serve to isolate the gates of the NMOS transistors 306 and 318 from leakage currents that typically exist on the OSC1 terminal. The output of the amplifier 330a is provided at the drain of NMOS transistor 306 which is connected to terminal OSC2.

FIGS. 4-7 provide schematic illustrations of alternate embodiments of the oscillator amplifier of the present invention. Many of the components in these alternate embodiments are identical to those discussed above in connection with FIG. 3 and, therefore, will not be discussed further.

Figure 4:
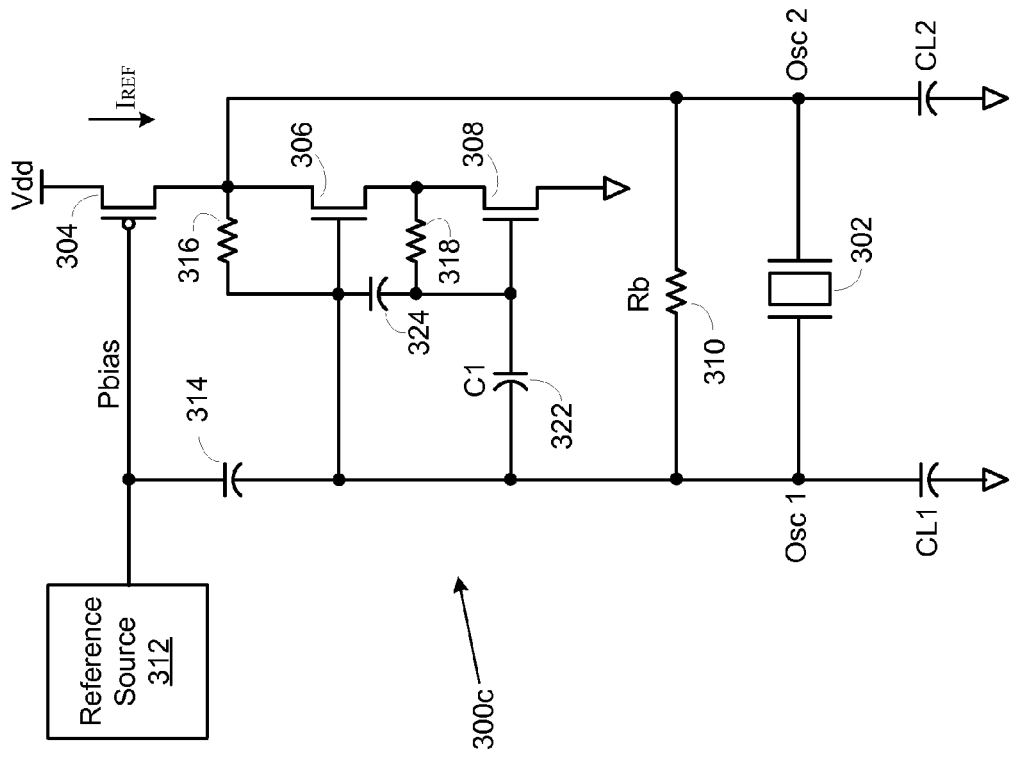
FIGS. 4-7 are schematic illustrations of alternate embodiments of the oscillator amplifier shown in FIG. 3.

FIG. 4 is a schematic illustration of an oscillator amplifier 300b comprising an additional capacitor 324 connected between the gates of NMOS transistors 306 and 308. The capacitor 324 provides an AC short between the gates of the two NMOS transistors, thereby increasing stability and improving noise rejection.

Figure 5:
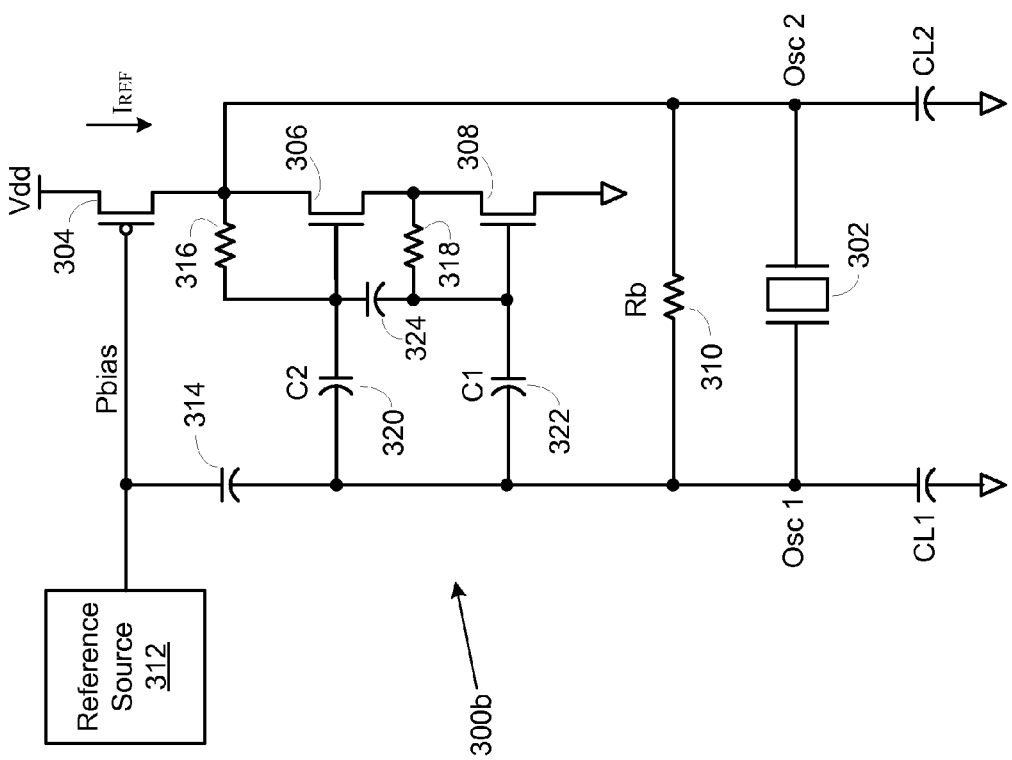

FIG. 5 is a schematic illustration of an oscillator amplifier 300c comprising a capacitor 324 connected between the gates of NMOS transistors 306 and 308, providing the advantages discussed above. In this embodiment, however, capacitor 320 has been omitted. While the capacitor 320 does provide the advantage of isolating the gates of the NMOS transistors from current leakage associated with the OSC1 terminal, acceptable performance can be obtained without the capacitor. In this embodiment of the invention wherein capacitor 320 is omitted, resistor 316 can also be omitted. In various embodiments of the invention, it is also possible to further reduce the component count by omitting the capacitor 324.

Figure 6:
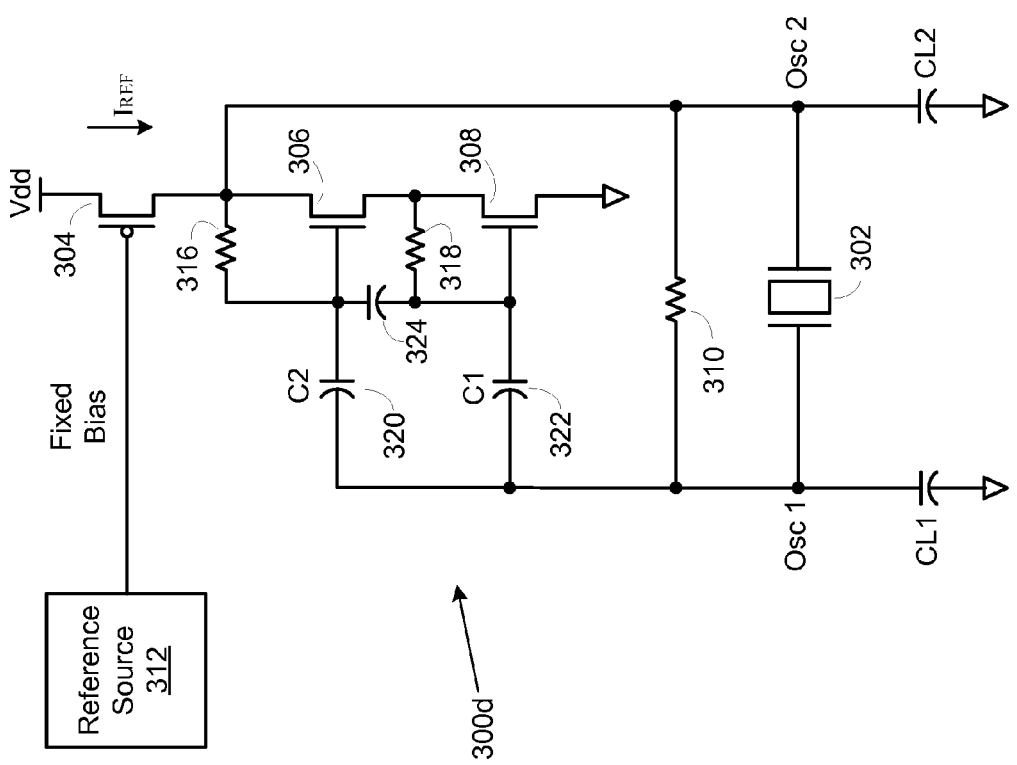

FIG. 6 is a schematic illustration of an oscillator amplifier 300d comprising an additional capacitor 324 connected between the gates of NMOS transistors 306 and 308. This embodiment of the oscillator amplifier is similar to the embodiment illustrated in FIG. 3b; however, in this embodiment, the reference source provides a fixed bias to the gate of the PMOS transistor 304. As discussed above, the capacitor 324 provides an AC short between the gates of the two NMOS transistors, thereby increasing stability and improving noise rejection.

Figure 7:
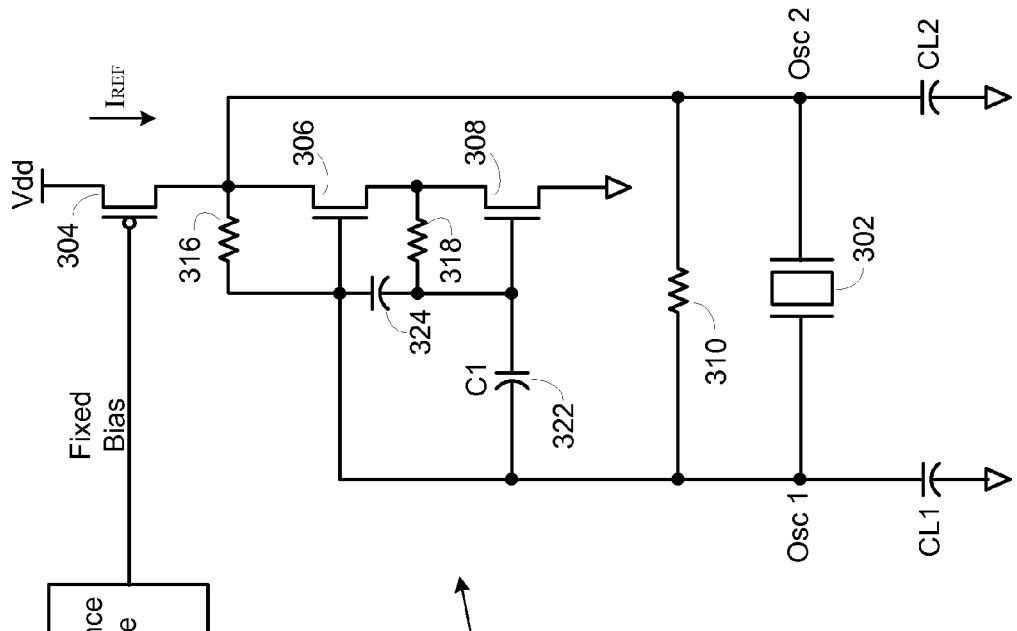

FIG. 7 is a schematic illustration of another embodiment of the oscillator amplifier of the present invention. In this embodiment, the reference source also provides a fixed bias to the gate of the PMOS transistor 304. In this embodiment, capacitor 324 is connected between the gates of NMOS transistors 306 and 308, providing the advantages discussed above. The capacitor 320 has been omitted. As discussed above, it is possible to obtain a significant improvement over prior art oscillator amplifiers without capacitor 320. In this embodiment of the invention wherein capacitor 320 is omitted, resistor 316 can also be omitted. Finally, it is possible to further reduce the component count by omitting the capacitor 324.

In the various embodiments of the invention, the NMOS transistors 306 and 308 operate in weak inversion, thereby providing the highest possible transconductance for a given bias current. The amplifier and loop voltage gains are proportional to transconductance and are therefore also maximized. The NMOS transistor 308 is used to increase the DC bias voltage of the amplifier (VOSC1 and VOSC2) and increase the amplifier gain.

Although the present invention comprises additional components, such as NMOS transistor 308, capacitor 322 and resistor 318, beyond those shown in prior art oscillator amplifiers, the cost associated with these additional components may be relatively minimal in some embodiments. The capacitor 322 can be very small (approximately 1 pF) and the NMOS transistor 322 is a small percentage of the overall module size (approximately two percent). Furthermore, there are several methods known in the art for implementing high-value resistors in a very small silicon area. Examples include biased transistors, low-bandwidth amplifiers, and undoped poly resistors. In some embodiments of the invention, the various bias resistors can be implemented using switched-capacitor resistors.

In some embodiments, the oscillator amplifier of the present invention may provide more than twice the DC voltage level of prior art oscillator amplifiers. By summing the Vgs of the NMOS transistors 306 and 308, where the Vgs of transistor 306 is slightly greater than transistor 308 due to its larger Vth (from Vsb>0), it is possible to increase DC level significantly, allowing for greater than 1V peak-to-peak oscillations without clipping at the supply rails with a supply voltage below 1.5V. The oscillator amplifier of the present invention also minimizes power consumption and radiated emissions while also decreasing the effects of electromagnetic interference (EMI).

From the description herein, those of skill in the art will appreciate that embodiments of the present invention may provide a low-power, high-gain amplifier for an oscillator which can support a substantial oscillation amplitude without clipping the oscillatory signal. One embodiment of the oscillator amplifier is broadly comprised of: an oscillation source operable to generate an oscillatory signal; and a stacked amplifier comprising first and second transistors operable to receive the oscillatory signal and the controlled reference current and to generate an amplified oscillatory signal therefrom, wherein the first transistor is configured with its gate and drain terminals resistively connected, thereby raising the DC level of the amplified oscillatory signal. In some embodiments of the invention, the first and second transistors comprise first and second NMOS transistors. In one embodiment, the first NMOS tranistor is coupled to an input terminal of the oscillator amplifier via a first capacitor and is operable to receive an input signal via the first capacitor. In other embodiments, the second NMOS transistor is configured with its gate and drain terminals resistively coupled and is coupled to the input terminal of the oscillator amplifier via a second capacitor. In one embodiment, the gates of the first and second NMOS transistors are capacitively coupled by a third capacitor.

In various embodiments, the oscillator amplifier further comprises a PMOS transistor operable to receive an input reference voltage and to generate a controlled reference current therefrom. In one embodiment, the PMOS transistor is controlled by a fixed bias. In another embodiment, the PMOS transistor is controlled by an amplitude-controlled bias. Furthermore, in some embodiments, the output reference current of the PMOS transistor is controlled by capacitively coupling an input signal to the base of the PMOS transistor.

One embodiment further comprises a method of using an oscillator amplifier to amplify an oscillatory signal. The method broadly comprises: using an oscillation source to generate an oscillatory signal; and using first and second transistors to receive the oscillatory signal and to generate an amplified oscillatory signal therefrom, wherein the first transistor is configured with its gate and drain terminals resistively coupled, thereby raising the DC level of the amplified oscillatory signal. In some embodiments of the method, the first and second transistors comprise first and second NMOS transistors. In one embodiment of the method, a first capacitor is used to couple the first NMOS transistor to an input terminal of the oscillator amplifier. In another embodiment of the method, the second NMOS transistor is configured with its gate and drain terminals resistively coupled, and a second capacitor is used to couple the second NMOS transistor to an input terminal of the oscillator amplifier. In some embodiments of the method, a third capacitor is used to capacitively couple the gates of the first and second NMOS transistors.

In other embodiments of the method, a PMOS transistor is used to receive a reference current and to generate a controlled reference current therefrom. In various embodiments, the PMOS transistor is controlled by a fixed bias or an amplitude-controlled bias.

Although the described exemplary embodiments disclosed herein are directed to various examples of an improved oscillator amplifier, the present invention is not necessarily limited to the example embodiments. For example, it will be apparent to those of skill in the art that example embodiments can be modified to substitute NMOS transistors in place of PMOS transistors, using techniques known to those of skill in the art. Furthermore, embodiments of the invention can be implemented using bipolar semiconductor devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An oscillator amplifier, comprising:
   an oscillation source operable to generate an oscillatory signal; and
   a stacked amplifier comprising first and second transistors of the same conductivity type operable to receive said oscillatory signal and to generate an amplified oscillatory signal therefrom, wherein said first and second transistors are configured with their respective control terminals resistively coupled to one of their current terminals, thereby raising the DC level of said amplified oscillatory signal.

2. The oscillator amplifier of claim 1, wherein said first transistor comprises a first NMOS transistor coupled to an input terminal of said oscillator amplifier via a first capacitor, wherein said first transistor is operable to receive an input signal via said first capacitor.

3. The oscillator amplifier of claim 2, wherein said second transistor comprises a second NMOS transistor coupled to said input terminal of said oscillator amplifier via a second capacitor and is operable to receive said input signal via said second capacitor.

4. The oscillator amplifier of claim 3, wherein the control terminals of said first and second NMOS transistors are capacitively coupled by a third capacitor.

5. The oscillator amplifier of claim 4, further comprising a PMOS transistor operable to receive an input reference current and to generate a controlled reference current therefrom.

6. The oscillator amplifier of claim 5, wherein said PMOS transistor is controlled by a fixed bias.

7. The oscillator amplifier of claim 5, wherein said PMOS transistor is controlled by an amplitude-controlled bias.

8. The oscillator amplifier of claim 5, wherein said controlled reference current generated by said PMOS transistor is controlled by capacitively coupling an input signal to the base of said PMOS transistor.

9. A method of using an oscillator amplifier to amplify an oscillatory signal, comprising:
   using an oscillation source to generate an oscillatory signal; and
   using a stacked amplifier comprising first and second transistors of the same conductivity type to receive said oscillatory signal and to generate an amplified oscillatory signal therefrom, wherein said first and second transistors are configured with their respective control terminals resistively coupled to one of their current terminals, thereby raising the DC level of said amplified oscillatory signal.

10. The method of claim 9, wherein said first transistor comprises a first NMOS transistor and wherein said method further comprises:
    using a first capacitor to couple said first NMOS transistor to an input terminal of said amplifier.

11. The method of claim 10, further comprising:
    using a second capacitor to couple said second transistor to an input terminal of said oscillator amplifier, wherein said second transistor comprises a NMOS transistor.

12. The method of claim 11, further comprising:
    using a third capacitor to capacitively couple the control terminals of said first and second NMOS transistors.

13. The method of claim 12, further comprising:
    using a PMOS transistor to receive a reference current and to generate a controlled reference current therefrom.

14. The method of claim 12, further comprising:
using an amplitude-controlled bias to control operation of said PMOS transistor.

15. The method of claim 14, further comprising:
capacitively coupling an input signal to the control terminal of said PMOS transistor to generate said controlled reference current.

16. An amplifier, comprising:
a PMOS transistor operable to receive an input reference current and to generate a controlled reference current therefrom; and
first and second NMOS transistors operable to receive an input signal and said controlled reference current and to generate an amplified signal therefrom, wherein said first NMOS transistor is configured with its control terminal and one of its current terminals resistively connected, thereby raising the DC level of said amplified signal.

17. The amplifier of claim 16, wherein operation of said PMOS transistor is controlled by a fixed bias.

18. The amplifier of claim 17, wherein operation of said PMOS transistor is controlled by an amplitude-controlled bias.

* * * * *